United States Patent
Hirakata et al.

(10) Patent No.: US 10,326,100 B2
(45) Date of Patent: Jun. 18, 2019

(54) METHOD FOR MANUFACTURING LIGHT-EMITTING DEVICE

(71) Applicant: Semiconductor Energy Laboratory Co., Ltd., Kanagawa-ken (JP)

(72) Inventors: Yoshiharu Hirakata, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/357,636

(22) Filed: Nov. 21, 2016

(65) Prior Publication Data

US 2017/0069867 A1 Mar. 9, 2017

Related U.S. Application Data

(63) Continuation of application No. 13/960,998, filed on Aug. 7, 2013, now Pat. No. 9,508,961.

(30) Foreign Application Priority Data

Aug. 10, 2012 (JP) .................................. 2012-178810

(51) Int. Cl.
*H01L 51/00* (2006.01)
*H01L 51/52* (2006.01)
(Continued)

(52) U.S. Cl.
CPC ........ *H01L 51/524* (2013.01); *H01L 27/3209* (2013.01); *H01L 51/003* (2013.01);
(Continued)

(58) Field of Classification Search
CPC .............. H01L 27/3209; H01L 51/003; H01L 51/5253; H01L 51/52; H01L 51/0097; H01L 51/56; H01L 2251/5361; H01L 2227/323; H01L 27/3244; H01L 2227/326; H01L 51/0096–0097;
(Continued)

(56) References Cited

U.S. PATENT DOCUMENTS 6,838,812 B2   1/2005 Uchida
6,956,324 B2  10/2005 Yamazaki
(Continued)

FOREIGN PATENT DOCUMENTS

CN   001714309 A   12/2005
CN   102122216 A    7/2011
(Continued)

OTHER PUBLICATIONS

Invitation to Pay Additional Fees re Application No. PCT/JP2013/071295, International Searching Authority, dated Sep. 3, 2013.
(Continued)

*Primary Examiner* — Bitew A Dinke
(74) *Attorney, Agent, or Firm* — Husch Blackwell LLP

(57) ABSTRACT

To provide a method for manufacturing a lightweight light-emitting device having a light-emitting region on a curved surface. The light-emitting region is provided on a curved surface in such a manner that a light-emitting element is formed on a flexible substrate supported in a plate-like shape and the flexible substrate deforms or returns.

9 Claims, 9 Drawing Sheets

(51) Int. Cl.
  *H01L 51/56* (2006.01)
  *H01L 27/32* (2006.01)
  *H04M 1/02* (2006.01)

(52) U.S. Cl.
  CPC .......... *H01L 51/0097* (2013.01); *H01L 51/52* (2013.01); *H01L 51/5253* (2013.01); *H01L 51/56* (2013.01); *H01L 27/3244* (2013.01); *H01L 2227/323* (2013.01); *H01L 2227/326* (2013.01); *H01L 2251/5338* (2013.01); *H01L 2251/5361* (2013.01); *H04M 1/0268* (2013.01); *Y02E 10/549* (2013.01); *Y02P 70/521* (2015.11)

(58) Field of Classification Search
  CPC ......... H01L 51/524–525; Y02P 70/521; Y02E 10/549; H04M 1/0268
  See application file for complete search history.

(56) References Cited

U.S. PATENT DOCUMENTS

| | | | |
|---|---|---|---|
| 7,002,531 B2 | 2/2006 | Koike | |
| 7,045,438 B2 | 5/2006 | Yamazaki et al. | |
| 7,050,835 B2 | 5/2006 | Hack et al. | |
| 7,060,591 B2 | 6/2006 | Yamazaki et al. | |
| 7,129,102 B2 | 10/2006 | Yamazaki | |
| 7,180,091 B2 | 2/2007 | Yamazaki et al. | |
| 7,180,093 B2 | 2/2007 | Takayama et al. | |
| 7,189,631 B2 | 3/2007 | Yamazaki et al. | |
| 7,190,503 B2 | 3/2007 | Ide | |
| 7,335,573 B2 | 2/2008 | Takayama et al. | |
| 7,368,307 B2 | 5/2008 | Cok | |
| 7,709,846 B2 | 5/2010 | Yamazaki et al. | |
| 7,786,544 B2 | 8/2010 | Yamazaki et al. | |
| 7,869,839 B2 | 1/2011 | Jung | |
| 7,906,784 B2 | 3/2011 | Koyama et al. | |
| 8,044,411 B2 | 10/2011 | Maruyama et al. | |
| 8,188,474 B2 | 5/2012 | Hatano et al. | |
| 8,222,666 B2 | 7/2012 | Hatano et al. | |
| 8,237,165 B2 | 8/2012 | Kim et al. | |
| 8,264,144 B2 | 9/2012 | Oikawa et al. | |
| 8,284,369 B2 | 10/2012 | Chida et al. | |
| 8,377,762 B2 | 2/2013 | Eguchi et al. | |
| 8,462,289 B2 | 6/2013 | Nishizawa et al. | |
| 8,494,021 B2 | 7/2013 | Yukawa et al. | |
| 8,593,061 B2 | 11/2013 | Yamada | |
| 8,648,839 B2 | 2/2014 | Liaw et al. | |
| 8,727,557 B2 | 5/2014 | Yuan et al. | |
| 8,780,089 B2 | 7/2014 | Yuan et al. | |
| 8,816,993 B2 | 8/2014 | Yuan et al. | |
| 8,911,653 B2 | 12/2014 | Yamazaki et al. | |
| 8,917,262 B2 | 12/2014 | Liaw et al. | |
| 9,063,597 B2 | 6/2015 | Liaw et al. | |
| 2002/0191301 A1 | 12/2002 | Tanaka | |
| 2003/0144034 A1 | 7/2003 | Hack et al. | |
| 2004/0099926 A1 | 5/2004 | Yamazaki et al. | |
| 2005/0062412 A1 | 3/2005 | Taniguchi et al. | |
| 2005/0117197 A1 | 6/2005 | Ide | |
| 2006/0098153 A1 | 5/2006 | Slikkerveer et al. | |
| 2006/0108588 A1* | 5/2006 | Osame | H01L 25/048 257/72 |
| 2006/0192915 A1 | 8/2006 | Kimura | G02F 1/1339 349/151 |
| 2006/0216909 A1 | 9/2006 | Yamazaki et al. | |
| 2006/0220551 A1 | 10/2006 | Yamazaki | |
| 2006/0273304 A1 | 12/2006 | Cok | |
| 2007/0059854 A1 | 3/2007 | Huang et al. | |
| 2007/0177075 A1 | 8/2007 | Kimoto | |
| 2007/0254456 A1* | 11/2007 | Maruyama | G06K 19/07749 438/458 |
| 2008/0007538 A1* | 1/2008 | Kotera | G06F 3/0412 345/173 |
| 2008/0062112 A1* | 3/2008 | Umezaki | G09G 3/342 345/100 |
| 2008/0205066 A1* | 8/2008 | Ohta | G02B 5/045 362/311.06 |
| 2009/0002586 A1* | 1/2009 | Kimura | G02F 1/136213 349/39 |
| 2009/0143109 A1* | 6/2009 | Yamazaki | G06F 1/1626 455/566 |
| 2009/0257207 A1* | 10/2009 | Wang | G06F 1/1626 361/752 |
| 2010/0006845 A1 | 1/2010 | Seo et al. | |
| 2010/0065832 A1 | 3/2010 | Sugimoto | |
| 2010/0123160 A1 | 5/2010 | Hatano et al. | |
| 2010/0195296 A1* | 8/2010 | Nishiwaki | H04M 1/0237 361/752 |
| 2010/0202104 A1* | 8/2010 | Idera | H04N 5/2252 361/679.01 |
| 2010/0253902 A1 | 10/2010 | Yamazaki et al. | |
| 2010/0293782 A1* | 11/2010 | Yamazaki | H01L 51/0097 29/825 |
| 2010/0308335 A1 | 12/2010 | Kim et al. | |
| 2011/0001146 A1 | 1/2011 | Yamazaki et al. | |
| 2011/0005827 A1 | 1/2011 | Shimomichi | |
| 2011/0007042 A1 | 1/2011 | Miyaguchi | |
| 2011/0018025 A1 | 1/2011 | Bertram | |
| 2011/0062434 A1* | 3/2011 | Eguchi | H01L 27/12 257/43 |
| 2011/0140598 A1 | 6/2011 | Yamazaki et al. | |
| 2011/0175101 A1 | 7/2011 | Hatano et al. | |
| 2011/0318889 A1 | 12/2011 | Chida | |
| 2012/0002133 A1* | 1/2012 | Yamazaki | G09G 3/342 349/61 |
| 2012/0020056 A1 | 1/2012 | Yamagata et al. | |
| 2012/0126234 A1 | 5/2012 | Yamazaki et al. | |
| 2012/0126693 A1 | 5/2012 | Seo et al. | |
| 2012/0205675 A1 | 8/2012 | Yamazaki et al. | |
| 2012/0249465 A1 | 10/2012 | Lin et al. | |
| 2012/0262432 A1 | 10/2012 | Kamata et al. | |
| 2012/0320509 A1 | 12/2012 | Kim et al. | |
| 2013/0002133 A1 | 1/2013 | Jin et al. | |
| 2013/0002583 A1 | 1/2013 | Jin et al. | |
| 2013/0016050 A1* | 1/2013 | Allore | H04M 1/0202 345/173 |
| 2013/0083496 A1* | 4/2013 | Franklin | G06F 1/1626 361/749 |
| 2013/0140528 A1 | 6/2013 | De Kok et al. | |
| 2013/0161684 A1 | 6/2013 | Momma et al. | |
| 2013/0306231 A1 | 11/2013 | Tanaka et al. | |
| 2014/0063719 A1* | 3/2014 | Yamazaki | G06F 1/1601 361/679.21 |
| 2014/0070203 A1 | 3/2014 | Tanaka et al. | |
| 2015/0053959 A1 | 2/2015 | Yamazaki et al. | |

FOREIGN PATENT DOCUMENTS

| | | |
|---|---|---|
| CN | 102804445 A | 11/2012 |
| EP | 1 239 362 A2 | 9/2002 |
| EP | 2 259 321 A1 | 12/2010 |
| EP | 2 262 205 A2 | 12/2010 |
| EP | 2 343 629 A2 | 7/2011 |
| EP | 2 346 108 A1 | 7/2011 |
| EP | 2 456 175 A1 | 5/2012 |
| EP | 2 928 162 A1 | 10/2015 |
| JP | 02-250031 A | 10/1990 |
| JP | 06-194680 A | 7/1994 |
| JP | 10-065357 A | 3/1998 |
| JP | 2000-311781 A | 11/2000 |
| JP | 2002-258774 A | 9/2002 |
| JP | 2002-350572 A | 12/2002 |
| JP | 2002350572 A * | 12/2002 |
| JP | 2003-264084 A | 9/2003 |
| JP | 2004-077382 A | 3/2004 |
| JP | 2005-134460 A | 5/2005 |
| JP | 2006-039471 A | 2/2006 |
| JP | 2006-507528 | 3/2006 |
| JP | 2006-091894 A | 4/2006 |
| JP | 2007-326259 A | 12/2007 |
| JP | 2008-083645 A | 4/2008 |
| JP | 2009-170173 A | 7/2009 |
| JP | 2011-003537 A | 1/2011 |

(56) References Cited

FOREIGN PATENT DOCUMENTS

| | | |
|---|---|---|
| JP | 2011-023826 A | 2/2011 |
| JP | 2011-047976 A | 3/2011 |
| JP | 2011-237661 A | 11/2011 |
| JP | 2013-025015 A | 2/2013 |
| JP | 2013-517525 | 5/2013 |
| KR | 2005-0085066 A | 8/2005 |
| TW | 200400746 | 1/2004 |
| TW | 200816899 | 4/2008 |
| TW | 201044899 | 12/2010 |
| TW | 201225619 | 6/2012 |
| WO | WO 2003/050963 A1 | 6/2003 |
| WO | WO 2004/049050 A1 | 6/2004 |
| WO | WO 2011/087361 A2 | 7/2011 |

OTHER PUBLICATIONS

Taiwanese Office Action re Application No. TW 106112607, dated Nov. 8, 2017.

\* cited by examiner

METHOD FOR MANUFACTURING LIGHT-EMITTING DEVICE

This application is a continuation of copending U.S. application Ser. No. 13/960,998, filed on Aug. 7, 2013 which is incorporated herein by reference.

TECHNICAL FIELD

The present invention relates to a method for manufacturing a light-emitting device, and in particular relates to a method for manufacturing a light-emitting device having a light-emitting region on a curved surface.

BACKGROUND ART

A light-emitting device in which an electroluminescence light-emitting element (also referred to as EL element) is provided on an inner surface of a substrate having moisture impermeability, which is molded into a curved shape in advance, has been known (see Patent Document 1).

Further, a method for manufacturing a light-emitting device by forming an organic EL element over a flexible substrate which is attached to a flat plate which can be separated, separating the flexible substrate from the flat plate, and curving the flexible substrate along a shape of a container or the like has been known (see Patent Document 2).

Furthermore, a light-emitting device in which a flexible EL element sheet is interposed between internal and external shape-holding plates where a curved surface portion is formed has been known (see Patent Document 3).

REFERENCE

Patent Document

[Patent Document 1] Japanese Published Patent Application No. 2003-264084
[Patent Document 2] Japanese Published Patent Application No. 2000-311781
[Patent Document 3] Japanese Published Patent Application No. 2006-39471

DISCLOSURE OF INVENTION

An organic EL element includes a layer containing a light-emitting organic compound between a pair of electrodes. The thickness of the layer containing a light-emitting organic compound is as extremely small as approximately several tens of nanometers to several hundreds of nanometers. When the thickness is uneven, a defect of luminance unevenness or a short circuit between a pair of electrodes, or the like occurs in some cases.

Accordingly, a processing technique for forming the layer containing a light-emitting organic compound so that the above-described defect does not occur has been required in the case of forming an organic EL element having a curved shape on an inner surface of a substrate having moisture impermeability, which is molded into a curved shape in advance.

Further, an organic EL element having elasticity with which the organic EL element returns to a plate-like shape cannot be curved in accordance with a shape of a housing of a device having a complex curved surface (e.g., a curved surface where the curvature radius changes) in some cases.

When the method in which a flexible organic EL element is interposed between two shape-holding plates and curved is used, although the flexible organic EL element can be curved in accordance with a complex curved surface, the weight or cost is increased because the two shape-holding plates are used.

An embodiment of the present invention is made in view of the foregoing technical background. Accordingly, an object is to provide a method for manufacturing a lightweight light-emitting device having a light-emitting region on a curved surface.

In order to achieve the above object, an embodiment of the present invention is made with a focus on a method for forming a light-emitting region on a curved surface in such a manner that a light-emitting element is formed on a flexible substrate supported in a flat plate-like shape and the flexible substrate deforms or returns. This leads to a method for manufacturing a light-emitting device having a structure exemplified in this specification.

One embodiment of the present invention is a method for manufacturing a light-emitting device having a light-emitting region on a curved surface, including a first step of preparing a flexible substrate provided with a desired curved surface in advance; a second step of forming a light-emitting element which includes a layer containing a light-emitting organic compound between a pair of electrodes so as to be in contact with the flexible substrate supported in a flat plate-like shape; and a third step of deformation or return of a portion of the flexible substrate where a light-emitting region of the light-emitting element is provided into a shape having a curved surface.

The method for manufacturing a light-emitting device which is one embodiment of the present invention includes a step of forming a light-emitting element on a flexible substrate which is provided with a desired curved surface in advance and supported in a flat plate-like shape and a step of providing a light-emitting region on a curved surface in such a manner that part of the flexible substrate where the light-emitting element is provided is deformed or returned into a shape having a curved surface. Thus, the light-emitting region of the light-emitting element can be provided on a curved surface without using a shape-holding plate or the like and without another member being in contact with the light-emitting element for the deformation. As a result, a method for manufacturing a lightweight light-emitting device having a light-emitting region on a curved surface can be provided.

Another embodiment of the present invention is a method for manufacturing a light-emitting device having a light-emitting region on a curved surface, including a first step of forming a light-emitting element which includes a layer containing a light-emitting organic compound between a pair of electrodes so as to be in contact with a first substrate which is flexible and supported in a flat plate-like shape; a second step of providing, at a first temperature T1, a second substrate having a heat shrink property on a surface side of the first substrate where the light-emitting element is not formed; and a third step of providing the light-emitting region of the light-emitting element on a curved surface by heating the second substrate to a second temperature T2.

The method for manufacturing a light-emitting device of the above embodiment of the present invention includes a step of forming a light-emitting element on a first substrate which is flexible and is supported in a flat plate-like shape and a step of providing the light-emitting region on a curved surface in such a manner that the second substrate having a heat shrink property is attached to the first substrate which is flexible and the attached second substrate having a heat shrink property is deformed. Thus, the light-emitting region of the light-emitting element can be provided on a curved surface without using a shape-holding plate or the like and without another member being in contact with the light-emitting element. As a result, a method for manufacturing a lightweight light-emitting device having a light-emitting region on a curved surface can be provided.

Another embodiment of the present invention is a method for manufacturing a light-emitting device having a light-emitting region on a curved surface, including a first step of forming a light-emitting element which includes a layer containing a light-emitting organic compound between a pair of electrodes so as to be in contact with a first substrate which is flexible and supported in a flat plate-like shape; a second step of providing, at a first temperature T1, a second substrate having a heat shrink property on a surface side of the first substrate where the light-emitting element is formed; and a third step of providing the light-emitting region of the light-emitting element on a curved surface by heating the second substrate to a second temperature T2.

The method for manufacturing a light-emitting device of the above embodiment of the present invention includes a step of forming the light-emitting element on the first substrate which is flexible and supported in a flat plate-like shape and a step of providing the light-emitting region on a curved surface in such a manner that the second substrate having a heat shrink property is attached to the first substrate which is flexible and the attached second substrate having a heat shrink property is deformed. Thus, the light-emitting region of the light-emitting element can be provided on a curved surface without using a shape-holding plate or the like and without another member being in contact with the light-emitting element. As a result, a method for manufacturing a lightweight light-emitting device having a light-emitting region on a curved surface can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device or a light source (including a lighting device). In addition, the light-emitting device includes any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted over a substrate over which a light-emitting element is formed by a chip on glass (COG) method.

According to an embodiment of the present invention, a method for manufacturing a lightweight light-emitting device having a light-emitting region on a curved surface can be provided.

BEST MODE FOR CARRYING OUT THE INVENTION

Figure 1:
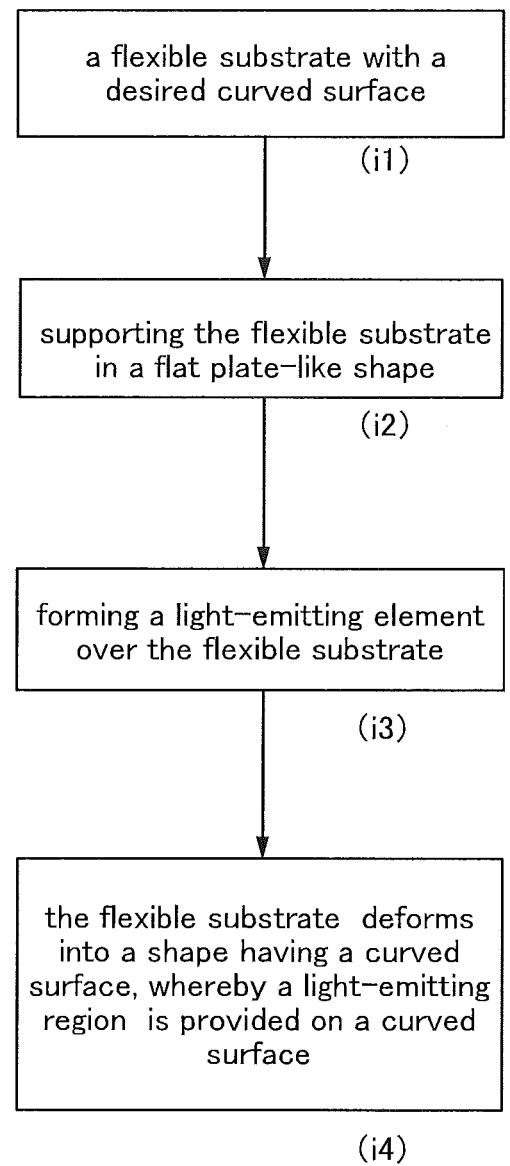
FIG. 1 is a flowchart showing a method for manufacturing a light-emitting device of one embodiment of the present invention.

Embodiments of the present invention are described with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

Embodiment 1

In this embodiment, a method for manufacturing a light-emitting device of one embodiment of the present invention is described with reference to FIG. 1 and FIGS. 2A to 2D. FIG. 1 illustrates a flowchart showing a method for manufacturing a light-emitting device of one embodiment of the present invention, and FIGS. 2A to 2D are schematic views each illustrating a structure of the light-emitting device in a manufacturing step.

A method for manufacturing a light-emitting device 100 having a light-emitting region on a curved surface, which is exemplified in this embodiment, is as follows.

Figure 2A:
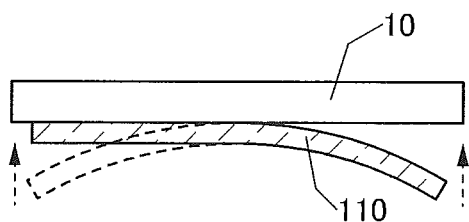
FIGS. 2A to 2D are diagrams illustrating a method for manufacturing a light-emitting device of one embodiment of the present invention.

In a first step, a flexible substrate 110 provided with a desired curved surface in advance is prepared (see (i1) in FIG. 1 and FIG. 2A).

Figure 2B:
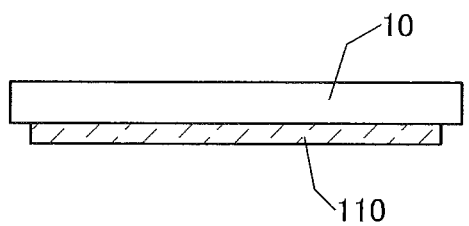
Figure 2C:
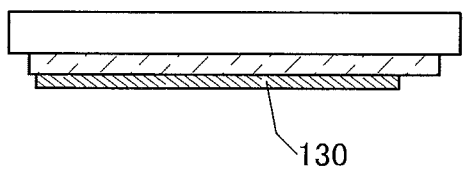

In a second step, a light-emitting element 130 which includes a layer containing a light-emitting organic compound between a pair of electrodes is formed in contact with the flexible substrate 110 supported in a flat plate-like shape (see (i2) and (i3) in FIG. 1, FIG. 2B, and FIG. 2C).

Figure 2D:
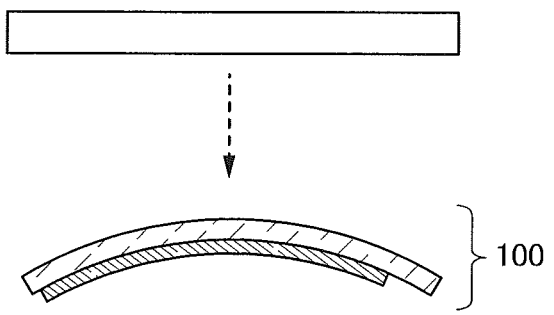

In a third step, the flexible substrate 110 deforms or returns into a shape having a curved surface, whereby a light-emitting region of the light-emitting element 130 in the light-emitting device 100 is provided on a curved surface (see (i4) in FIG. 1 and FIG. 2D).

Note that a substrate supporting unit 10 supports the flexible substrate 110 in a flat plate-like shape.

The method for manufacturing a light-emitting device exemplified in this embodiment includes a step of forming the light-emitting element 130 on the flexible substrate 110 which is provided with a desired curved surface in advance and supported in a flat plate-like shape and a step of providing the light-emitting region on a curved surface in such a manner that the flexible substrate 110 deforms or returns into a shape having a curved surface. Thus, the light-emitting region of the light-emitting element 130 can be provided on a curved surface without using a shape-holding plate or the like and without another member being in contact with the light-emitting element 130 for the deformation. As a result, a method for manufacturing the lightweight light-emitting device 100 having a light-emitting region on a curved surface can be provided.

Structures of the flexible substrate 110 which spontaneously deforms or returns into a shape having a curved surface and the substrate supporting unit 10 which fixes the flexible substrate 110 in a flat plate-like shape, which can be used for the method for manufacturing a light-emitting device of one embodiment of the present invention, are described.

<<Substrate which Spontaneously Deforms or Returns into a Shape Having a Curved Surface>>

In a step of forming the light-emitting element 130, the flexible substrate 110 exemplified in this embodiment is supported in a flat plate-like shape by the substrate supporting unit 10, and in a later step, the substrate supporting unit 10 is released from the flexible substrate 110, whereby the flexible substrate 110 returns into a shape having a curved surface.

As the flexible substrate 110 which spontaneously deforms or returns into a shape having a curved surface, for example, a metal plate or a plastic plate which was subjected to a molding process so as to have a curved surface, a plate-like composite material, or the like can be given.

As a specific example of a metal plate, a metal plate having elasticity can be given in addition to a material of a plate spring, such as spring steel, stainless steel, brass, albata, phosphor bronze, or beryllium bronze.

As a specific example of a plastic plate, a plate formed with any of a variety of engineering plastic, or the like can be given in addition to an acrylic plate, a polycarbonate plate, or the like.

As a plate-like composite material, a composite material of a glass fiber and a resin, a stacked material of a metal plate or a plastic plate and another material, or the like can be given.

Note that the flexible substrate 110 may include another material such as an extremely thin glass plate (e.g. a glass plate with a thickness of several tens of micrometers) or a film which prevents an impurity (e.g. water or oxygen) from passing therethrough (e.g. an inorganic material film, specifically, a silicon oxide film, a silicon nitride film, or the like).

Further, in the case where light emitted from the light-emitting element 130 is extracted to the flexible substrate 110 side, a material having a visible-light-transmitting property is used for the flexible substrate 110 and an electrode of the light-emitting element 130 which is placed on the flexible substrate 110 side.

The curved surface of the flexible substrate 110 can be deformed into a flat plate-like shape. Further, the flexible substrate 110 deformed into a flat plate-like shape can return into a shape having a curved surface. Such a curved surface can be referred to as "developable surface". A developable surface means a curved surface through a given point of which at least one straight line can be drawn.

Note that the thickness of the flexible substrate 110 and the curvature radius of the curved surface of the flexible substrate 110 may depend on a structure of a light-emitting element which is to be formed thereon. For example, when the thickness of the flexible substrate 110 is greater than or equal to 40 μm and less than or equal to 300 μm and the curvature radius is greater than or equal to 20 mm, a defect in which the light-emitting element 130 is damaged when the flexible substrate 110 returns into a shape having a curved surface can be prevented.

<<Substrate Supporting Unit>>

The substrate supporting unit 10 supports the flexible substrate 110 which spontaneously deforms or returns into a shape having a curved surface so that the flexible substrate 110 has a flat plate-like shape. FIG. 2A schematically illustrates a state where the flexible substrate 110 molded into a convex shape upward in advance is prepared in a flat plate-like shape by being supported by the substrate supporting unit 10 along its surface. Alternatively, a substrate molded into a convex shape downward in advance can be prepared in a flat plate-like shape by being supported by the substrate supporting unit 10 along its surface.

The flexible substrate 110 may be supported in a flat plate-like shape along the surface of the substrate supporting unit 10 in such a manner that edge portions of the flexible substrate 110 are held by, for example, a clamping unit.

Alternatively, a magnetic force may be used. The flexible substrate 110 is drawn using a magnetic force along the surface of the substrate supporting unit 10. Further alternatively, the flexible substrate 110 may be supported in a flat plate-like shape in such a manner that a fixture is drawn to the surface of the substrate supporting unit 10 by a magnetic force and the flexible substrate 110 is interposed between the fixture and the substrate supporting unit 10.

Note that the following method may be employed: the flexible substrate 110 provided with a curved surface in advance is bonded to a plate-like manufacturing substrate having rigidity with an adhesive which can be separated so that the flexible substrate 110 is a plate-like stacked plate, and the light-emitting element 130 is formed on the stacked plate. When this method is used, the substrate supporting unit 10 can deal with the flexible substrate 110 like a plate-like substrate.

Each step in the method for manufacturing a light-emitting device of one embodiment of the present invention is described below.

<<First Step>>

The flexible substrate 110 provided with a desired curved surface in advance, which spontaneously deforms or returns into a shape having a curved surface, is supported in a flat plate-like shape along the surface of the substrate supporting unit 10 (see FIGS. 2A and 2B).

<<Second Step>>

The light-emitting element 130 is formed in contact with the flexible substrate 110 supported in a flat plate-like shape along the surface of the substrate supporting unit 10 (see FIG. 2C).

Note that the light-emitting element 130 includes a first electrode, a second electrode, and a layer containing a light-emitting organic compound therebetween. A structure of the light-emitting element 130 is described in detail in Embodiment 5.

As a method for forming the light-emitting element 130, the following method can be given, for example: one electrode is formed in contact with the flexible substrate 110, a layer containing a light-emitting organic compound is formed on the one electrode, and the other electrode is stacked on the layer containing a light-emitting organic compound.

As another method, a method using a manufacturing substrate on a surface of which a layer capable of being separated from a layer which is stacked thereon is formed can be given.

Over the layer which is capable of being separated and formed over the manufacturing substrate, the one electrode is formed. The layer containing a light-emitting organic compound is formed over the one electrode. The other electrode is stacked over the layer containing a light-emitting organic compound.

Next, the flexible substrate 110 prepared in a flat plate-like shape is attached to the other electrode side of the light-emitting element 130 with an adhesive. Further, the light-emitting element 130 is separated from the layer which is capable of being separated from a layer which is stacked thereon and formed over the manufacturing substrate, whereby the light-emitting element 130 is transferred to the flexible substrate 110 supported in a flat plate-like shape. The light-emitting element 130 may be formed on the flexible substrate 110 by the above-described method.

Alternatively, a second flexible substrate is attached to the other electrode side of the light-emitting element 130 with an adhesive. Next, the light-emitting element 130 is separated from the layer which is capable of being separated from a layer which is stacked thereon and formed over the manufacturing substrate, whereby the light-emitting element 130 is transferred to the second substrate. Further, the flexible substrate 110 prepared in a flat plate-like shape is attached to the one electrode side of the light-emitting element 130 with an adhesive. The light-emitting element 130 may be formed on the flexible substrate 110 by the above-described method.

When the method in which the light-emitting element is formed over the manufacturing substrate on a surface of which the layer capable of being separated from a layer which is stacked thereon is formed is used, a film which cannot be provided directly on the flexible substrate 110 (e.g. a film which can be formed only at a temperature which exceeds the heat resistance of the flexible substrate 110) can be provided between the flexible substrate 110 and the light-emitting element 130.

Specifically, a film which suppresses diffusion of an impurity into the light-emitting element 130 (e.g. an oxide film or a nitride film, specifically, a silicon oxide film or a silicon nitride film) can be provided between the light-emitting element 130 and a plastic film.

Further, a circuit, such as a wiring which supplies power to the light-emitting element 130 or a transistor which drives the light-emitting element 130, can be formed so as to overlap with the layer capable of being separated from a layer which is stacked thereon. Thus, a circuit which cannot be provided directly on the flexible substrate 110 can be provided between the substrate 110 and the light-emitting element 130. For example, an active matrix light-emitting device (also referred to as active matrix display device) can be manufactured over the flexible substrate 110.

The reliability of the light-emitting element 130 is lowered due to an impurity (e.g. water or oxygen) in some cases. A sealing film having a gas barrier property and flexibility is preferably provided between the flexible substrate 110 and the light-emitting element 130 in order to suppress diffusion of an impurity into the light-emitting element 130.

As the sealing film having a gas barrier property and flexibility, a glass plate, a metal foil, a plastic film where an inorganic film having a gas barrier property is formed, or the like, each of which has a thickness of several tens to several hundreds of micrometers, can be given, for example. Note that the plastic film where an inorganic film having a gas barrier property is formed can be formed in such a manner that a film which has a favorable gas barrier property and is formed over the layer which is capable of being separated from a layer which is stacked thereon and formed over the manufacturing substrate is transferred to a plastic film.

<<Third Step>>

The substrate supporting unit 10 is released from the flexible substrate 110. The flexible substrate 110 provided with a desired curved surface in advance spontaneously deforms or returns into a shape having a curved surface. As a result, the light-emitting region of the light-emitting element 130 can be provided on a curved surface (see FIG. 2D).

Note that when the flexible substrate 110 which is deformed in a flat plate-like shape spontaneously returns into a shape having a curved surface, the surface of the substrate 110 stretches, and thus stress is applied to the light-emitting element 130. In order to suppress stress which is to be applied to the light-emitting element 130, the thickness of the flexible substrate 110 is preferably greater than or equal to 40 μm and less than or equal to 300 μm. The curvature radius of the curved surface obtained in such a manner that the flexible substrate 110 spontaneously returns is preferably greater than or equal to 20 mm.

In the case where the flexible substrate 110 spontaneously deforms or returns so that the surface on which the light-emitting element 130 is formed has a concave shape, the compressive stress applied to a surface side of the light-emitting element 130 which is in contact with the flexible substrate 110 is larger than that applied to a surface side of the light-emitting element 130 which is not in contact with the flexible substrate 110.

Further, in the case where the flexible substrate 110 spontaneously deforms or returns so that the surface on which the light-emitting element 130 is formed has a convex shape, the tensile stress applied to the surface side of the light-emitting element 130 which is in contact with the flexible substrate 110 is larger than that applied to the surface side of the light-emitting element 130 which is not in contact with the flexible substrate 110.

As described above, although uneven stress is applied to the light-emitting element 130, because the thickness of the light-emitting element 130 is extremely small (for example, the thickness can be approximately greater than or equal to 100 nm and less than or equal to 600 nm), a difference in stress applied to the both surfaces of the light-emitting element 130 is small. As a result, the light-emitting element 130 is not easily damaged by spontaneous deformation or return of the flexible substrate 110.

This embodiment can be implemented in combination with any of the other embodiments in this specification as appropriate.

Embodiment 2

Figure 3:
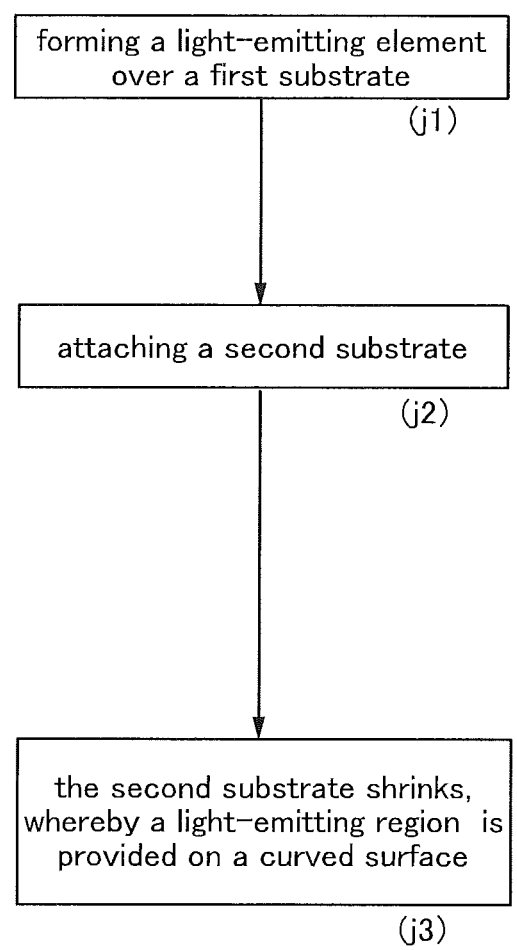
FIG. 3 is a flow chart showing a method for manufacturing a light-emitting device of one embodiment of the present invention.

In this embodiment, a method for manufacturing a light-emitting device of one embodiment of the present invention is described with reference to FIG. 3 and FIGS. 4A to 4E. FIG. 3 illustrates a flowchart showing a method for manufacturing a light-emitting device of one embodiment of the present invention, and FIGS. 4A to 4E are schematic views each illustrating a structure of the light-emitting device in a manufacturing step.

A method for manufacturing a light-emitting device 200 having a light-emitting region on a curved surface, which is exemplified in this embodiment, is as follows.

Figure 4A:
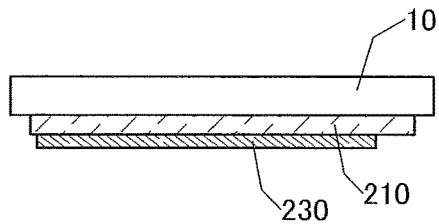
FIGS. 4A to 4E are diagrams illustrating methods for manufacturing a light-emitting device of one embodiment of the present invention.

In a first step, a light-emitting element 230 which includes a layer containing a light-emitting organic compound between a pair of electrodes is formed in contact with a first substrate 210 which is flexible and supported in a flat plate-like shape (see (j1) in FIG. 3 and FIG. 4A).

Figure 4B:
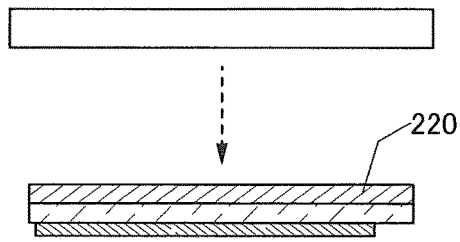

In a second step, a second substrate 220 having a heat shrink property is provided at a first temperature T1 with the first substrate 210 interposed between the second substrate 220 and the light-emitting element 230 (see (j2) in FIG. 3 and FIG. 4B). In other words, the second substrate 220 is provided on a surface side of the first substrate 210 where the light-emitting element 230 is not formed.

Figure 4C:
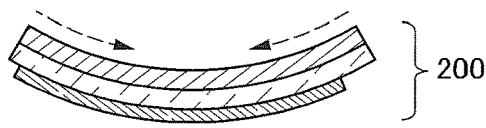

In a third step, the second substrate 220 is heated to a second temperature T2, whereby a light-emitting region of the light-emitting element 230 is provided on a curved surface (see (j3) in FIG. 3 and FIG. 4C).

Note that the substrate supporting unit 10 is used to support the first substrate 210 in a flat plate-like shape.

The method for manufacturing the light-emitting device 200 exemplified in this embodiment includes a step of forming the light-emitting element 230 on the first substrate 210 which is flexible and supported in a flat plate-like shape, and a step of providing the light-emitting region on a curved surface in such a manner that the second substrate 220 having a heat shrink property is attached to the first substrate 210 which is flexible and the attached second substrate 220 having a heat shrink property is deformed. Thus, the light-emitting region of the light-emitting element 230 can be provided on a curved surface without using a shape-holding plate or the like and without another member being in contact with the light-emitting element 230 for the deformation. As a result, a method for manufacturing the light-weight light-emitting device 200 having a light-emitting region on a curved surface can be provided.

A structure of the second substrate 220 having a heat shrink property, which can be used in the method for manufacturing the light-emitting device 200 of one embodiment of the present invention, is described.

The second substrate 220 having a heat shrink property shrinks when heated from the first temperature T1 to the second temperature T2, and thus the size of the second substrate 220 is changed. For example, a shrink film (an uniaxially-stretched film, a biaxially-stretched film, or the like) can be used. In particular, an uniaxially-stretched film is suitable for formation of a developable surface because it can be controlled so as to shrink in one direction.

As a material which can be applied to the second substrate 220 having a heat shrink property, a polyvinyl chloride film, a polypropylene film, a polyethylene film, a polystyrene film, a polyethylene terephthalate film, or a stacked film including a film selected from these films can be given, for example. These films shrink by being heated to a temperature (e.g., about 80° C. to 120° C.) which is higher than room temperature. For example, the first temperature T1 can be room temperature and the second temperature T2 can be higher than room temperature.

Further, in the case where light emitted from the light-emitting element 230 is extracted from the flexible first substrate 210 side where the second substrate 220 having a heat shrink property is attached, a material having a visible-light-transmitting property is used for the second substrate 220 having a heat shrink property, the flexible first substrate 210, and an electrode of the light-emitting element 230 which is placed on the flexible first substrate 210 side.

Each step in the method for manufacturing a light-emitting device of one embodiment of the present invention is described below.

<<First Step>>

The light-emitting element 230 which includes the layer containing a light-emitting organic compound between the pair of electrodes is formed in contact with the first substrate 210 which is flexible and supported in a flat plate-like shape by the substrate supporting unit 10 (see FIG. 4A).

<<Second Step>>

The substrate supporting unit 10 is released from the first substrate 210 provided with the light-emitting element 230. Next, the second substrate 220 having a heat shrink property is provided at the first temperature T1 with the first substrate 210 interposed between the second substrate 220 and the light-emitting element 230 (see FIG. 4B). In other words, the second substrate 220 is provided on a surface side of the first substrate 210 where the light-emitting element 230 is not formed.

<<Third Step>>

The second substrate 220 shrinks by being heated to the second temperature T2, so that the light-emitting region of the light-emitting element 230 is provided on a curved surface (see FIG. 4C). Note that as a method for heating the substrate having a heat shrink property, a method in which a heated gas is blown on the second substrate 220, a method in which the substrate is transferred in a furnace filled with a heated gas, or the like can be given.

Modification Example

In a modification example of this embodiment, the method for manufacturing the light-emitting device 200 in which curved surfaces are selectively provided in the light-emitting region is described with reference to FIGS. 4D and 4E.

In the first step, the light-emitting element 230 which includes the layer containing a light-emitting organic compound between the pair of electrodes is formed in contact with the first substrate 210 which is flexible and supported in a flat plate-like shape.

Figure 4D:
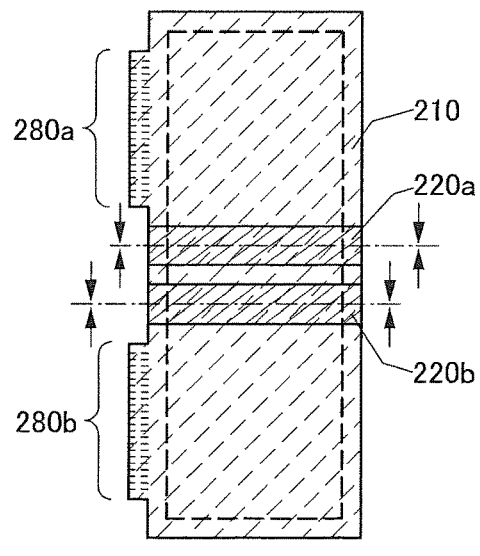

In the second step, a second substrate 220a and a second substrate 220b, which have a heat shrink property, are selectively provided at the first temperature T1 with the first substrate 210 interposed between the second substrate 220a and the light-emitting element 230 and between the second substrate 220b and the light-emitting element 230 (see FIG. 4D).

Figure 4E:
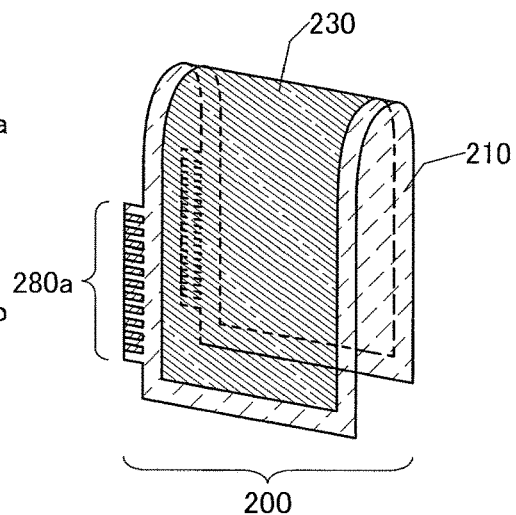

In the third step, the second substrate 220a and the second substrate 220b are heated to the second temperature T2, whereby part of the light-emitting region of the light-emitting element 230 is provided on the curved surfaces (see FIG. 4E).

The method for manufacturing the light-emitting device 200 exemplified in this embodiment includes a step of forming the light-emitting element 230 on the first substrate 210 which is flexible and supported in a flat plate-like shape, and a step of providing the light-emitting region on curved surfaces in such a manner that the second substrate 220a and the second substrate 220b, which have a heat shrink property and are selectively attached to the substrate 210, are deformed or returned. Thus, the curved surfaces can be provided on desired portions of the light-emitting element 230 without using a shape-holding plate or the like and without another member being in contact with the light-emitting element 230 for the deformation. As a result, a method for manufacturing the lightweight light-emitting device 200 having part of a light-emitting region on curved surfaces can be provided.

Note that arrows illustrated in FIG. 4D indicate directions in which the second substrate 220a and the second substrate 220b, which have a heat shrink property, shrink. The second substrates 220a and 220b having a heat shrink property are attached to the first substrate 210 so that ridge lines of the curved surfaces which are to be formed later are located at centerlines of the second substrate 220a and 220b. Thus, the curved surfaces can be provided on the desired portions.

Further, it is preferable to provide a terminal portion 280a and a terminal portion 280b which are electrically connected to the light-emitting element 230 in portions of the light-emitting device where the curved surface are not formed because the flexibility of the terminal portion is not lost. Thus, the terminal portion can be curved to be connected to a connector or the like. The terminal portion formed in a plate-like portion can be easily connected to an external device, for example, a connector or a flexible printed circuit where a terminal is provided in a flat plate-like shape, as compared to a terminal portion formed in a portion where a curved surface is formed. Note that when a terminal portion is provided for a portion where the curved surface is formed, the terminal portion can have rigidity.

This embodiment can be implemented in combination with any of the other embodiments in this specification as appropriate.

Embodiment 3

Figure 5:
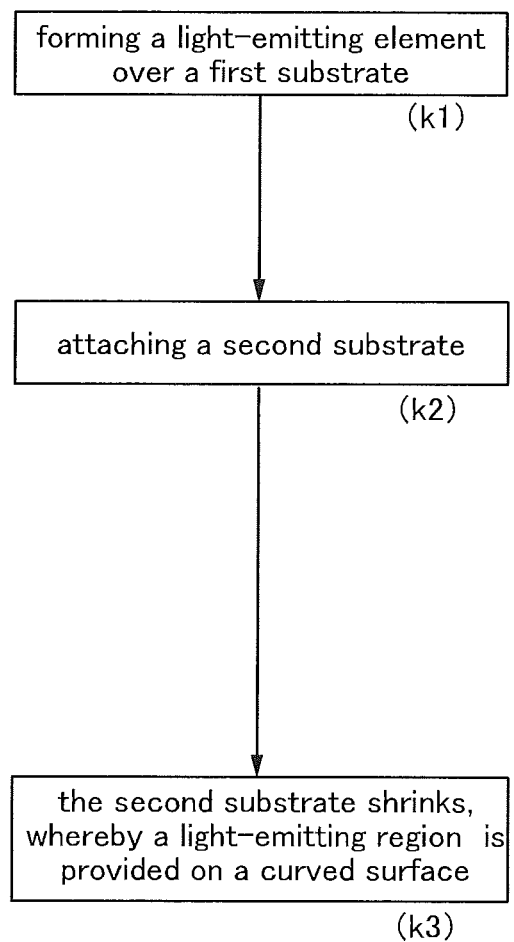
FIG. 5 is a flow chart showing a method for manufacturing a light-emitting device of one embodiment of the present invention.

In this embodiment, a method for manufacturing a light-emitting device of one embodiment of the present invention is described with reference to FIG. 5 and FIGS. 6A to 6E. FIG. 5 illustrates a flowchart showing a method for manufacturing a light-emitting device of one embodiment of the present invention, and FIGS. 6A to 6E are schematic views each illustrating a structure of the light-emitting device in a manufacturing step.

A method for manufacturing a light-emitting device 300 having a light-emitting region on a curved surface, which is exemplified in this embodiment, is as follows.

Figure 6A:
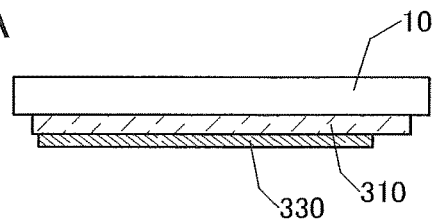
FIGS. 6A to 6E are diagrams illustrating methods for manufacturing a light-emitting device of one embodiment of the present invention.

In a first step, a light-emitting element 330 which includes a layer containing a light-emitting organic compound between a pair of electrodes is formed in contact with a first substrate 310 which is flexible and supported in a flat plate-like shape (see (k1) in FIG. 5 and FIG. 6A).

Figure 6B:
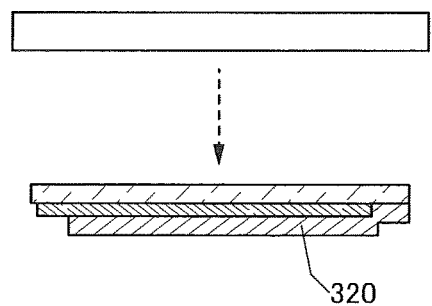

In a second step, a second substrate 320 having a heat shrink property is provided at the first temperature T1 with the light-emitting element 330 interposed between the first substrate 310 and the second substrate 320 (see (k2) in FIG. 5 and FIG. 6B). In other words, the second substrate 320 is provided on a surface side of the first substrate 310 where the light-emitting element 330 is formed.

Figure 6C:
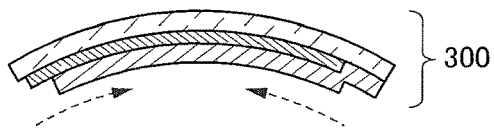

In a third step, the second substrate 320 is heated to the second temperature T2, whereby a light-emitting region of the light-emitting element 330 is provided on a curved surface (see (k3) in FIG. 5 and FIG. 6C).

Note that the substrate supporting unit 10 is used to support the first substrate 310 in a flat plate-like shape.

The method for manufacturing the light-emitting device exemplified in this embodiment includes a step of forming the light-emitting element 330 on the first substrate 310 which is flexible and supported in a flat plate-like shape, and a step of providing the light-emitting region on a curved surface in such a manner that the second substrate 320 having a heat shrink property is attached to the first substrate 310 and is deformed. Thus, the light-emitting region of the light-emitting element 330 can be provided on a curved surface without using a shape-holding plate or the like and without another member being in contact with the light-emitting element 330 for the deformation. As a result, a method for manufacturing the lightweight light-emitting device having a light-emitting region on a curved surface can be provided.

A structure of the second substrate 320 having a heat shrink property, which can be used in the method for manufacturing the light-emitting device 300 of one embodiment of the present invention, can be similar to that of the second substrate 220 having a heat shrink property, which is exemplified in Embodiment 2.

Note that in the case where light emitted from the light-emitting element 330 is extracted from the second substrate 320 side having a heat shrink property is provided, a material having a visible-light-transmitting property is used for the second substrate 320 having a heat shrink property and an electrode of the light-emitting element 330 which is placed on the second substrate 320 side.

Each step in the method for manufacturing a light-emitting device of one embodiment of the present invention is described below.

<<First Step>>

The light-emitting element 330 which includes the layer containing a light-emitting organic compound between the pair of electrodes is formed in contact with the first substrate 310 which is flexible and supported in a flat plate-like shape by the substrate supporting unit 10 (see FIG. 6A).

<<Second Step>>

The substrate supporting unit 10 is released from the first substrate 310 provided with the light-emitting element 330. Next, the second substrate 320 having a heat shrink property is provided at the first temperature T1 with the light-emitting element 330 interposed between the first substrate 310 and the second substrate 320 (see FIG. 6B). In other words, the second substrate 320 is provided on a surface side of the first substrate 310 where the light-emitting element 330 is formed.

<<Third Step>>

The second substrate 320 shrinks by being heated to the second temperature T2, so that the light-emitting region of the light-emitting element 330 is provided on a curved surface (see FIG. 6C).

When the second substrate 320 having a heat shrink property shrinks, the second substrate 320 applies stress to a surface of the light-emitting element 330 which is in contact with the second substrate 320. In the case where the light-emitting element 330 is damaged by this stress, a protection layer may be provided to overlap with the light-emitting element 330 so that the stress is not applied directly to the light-emitting element 330. In particular, a structure in which the protection layer covering the light-emitting element 330 is fixed to the first substrate 310 is effective.

Alternatively, the following structure may be employed: the light-emitting element 330 is formed over the first substrate 310 provided with a partition, and the partition is attached to the protection layer or the second substrate 320 having a heat shrink property. The partition relieves stress generated when the second substrate 320 having a heat shrink property shrinks, whereby the light-emitting element 330 can be prevented from being damaged.

Note that as a material which can be used for the protection layer, a flexible film which is attached with an adhesive, a resin layer obtained by application of a liquid material, or a film which can be formed by a sputtering method or a chemical vapor deposition method can be given, for example.

Further, the second substrate 320 and/or the protection layer can also serve as a sealing film which suppresses diffusion of an impurity (e.g., water or oxygen) into the light-emitting element 330.

Modification Example

In a modification example in this embodiment, the method for manufacturing the light-emitting device 300 in which convex curved surfaces and concave curved surfaces are selectively provided in the light-emitting region is described with reference to FIGS. 6D and 6E.

In the first step, the light-emitting element 330 which includes the layer containing a light-emitting organic compound between the pair of electrodes is formed in contact with the first substrate 310 which is flexible and supported in a flat plate-like shape.

In the second step, a second substrate 320a and a second substrate 320b, which have a heat shrink property, are selectively provided at the first temperature T1 with the light-emitting element 330 interposed between the first substrate 310 and the second substrate 320a and between the first substrate 310 and the second substrate 320b. Further, a second substrate 320c and a second substrate 320d, which have a heat shrink property, are selectively provided with the first substrate 310 interposed between the second substrate 320c and the light-emitting element 330 and between the second substrate 320d and the light-emitting element 330 (see FIG. 6D).

Figure 6D:
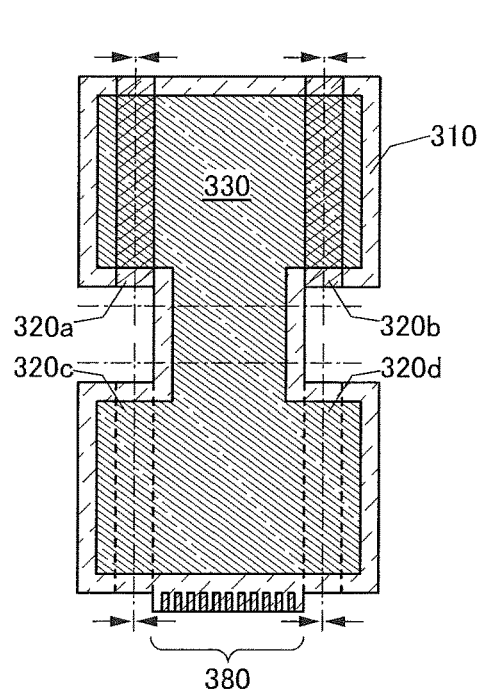
Figure 6E:
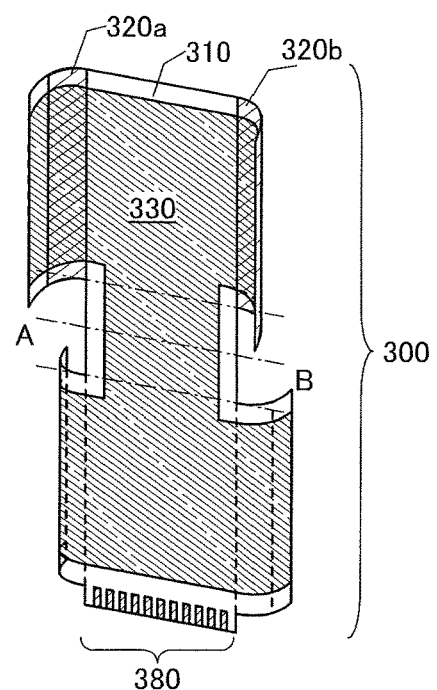

In the third step, the second substrates 320a, 320b, 320c, and 320d are heated to the second temperature T2, whereby part of the light-emitting region of the light-emitting element 330 is provided on curved surfaces (see FIG. 6E).

The method for manufacturing the light-emitting device 300 exemplified in this embodiment includes a step of forming the light-emitting element 330 on the first substrate 310 which is flexible and supported in a flat plate-like shape and a step of providing part of the light-emitting region on curved surfaces in such a manner that the second substrates having a heat shrink property which are selectively attached to the first substrate 310 are deformed. Thus, the curved surfaces can be provided on the desired portions of the light-emitting element 330 without using a shape-holding plate or the like and without another member being in contact with the light-emitting element 330 for the deformation. As a result, a method for manufacturing the light-weight light-emitting device 300 having part of a light-emitting region on curved surfaces can be provided.

Note that arrows illustrated in FIG. 6D indicate directions in which the second substrates 320a, 320b, 320c, and 320d, which have a heat shrink property, shrink. The second substrates 320a, 320b, 320c, and 320d having a heat shrink property are attached so that ridge lines of the curved surfaces which are to be formed later are located at the centerlines of the second substrates 320a, 320b, 320c, and 320d. Thus, the curved surfaces can be provided on desired portions.

Further, the light-emitting device 300 can be folded to be compact in such a manner that the convex curved surfaces and the concave curved surfaces overlap with each other by bend along dashed line A-B. Such a light-emitting device can be stored in a housing of a foldable information terminal device to be applied to a backlight of its display portion. Alternatively, it can be applied to an active matrix display device.

This embodiment can be implemented in combination with any of the other embodiments in this specification as appropriate.

Embodiment 4

Figure 7:
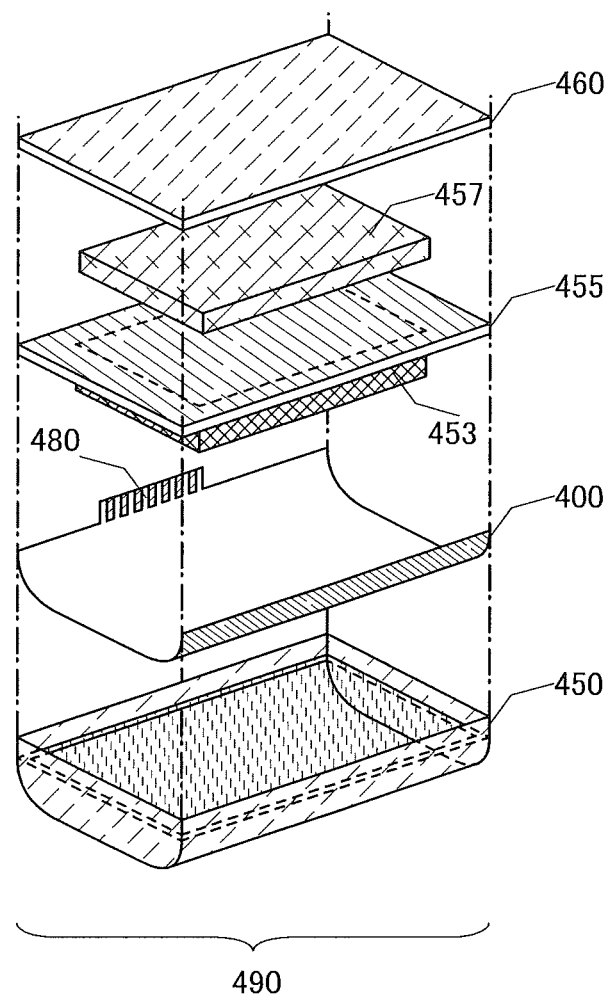
FIG. 7 is a diagram illustrating a housing where a light-emitting device of one embodiment of the present invention is stored.

In this embodiment, an example of a structure of a housing which can store a light-emitting device formed by the method for manufacturing a light-emitting device of one embodiment of the present invention is described with reference to FIG. 7.

A housing 490 exemplified in this embodiment includes an exterior unit 450, an outer lid 460, and an inner lid 455 which is between the exterior unit 450 and the outer lid 460. The inner lid 455 is attached to the exterior unit 450 with an adhesive or sealing material (e.g. an O-ring), so that a sealed space is formed between the inner lid 455 and the exterior unit 450.

A light-emitting device 400 manufactured by the manufacturing method of one embodiment of the present invention is stored in the sealed space formed between the inner lid 455 and the exterior unit 450 so that a light-emitting region of the light-emitting device 400 faces the exterior unit 450 side.

The inner lid 455 and the exterior unit 450 are each formed using a material which suppresses entry of an impurity (e.g., water or oxygen). With such a structure, reliability of the light-emitting device 400 stored in the sealed space can be prevented from being reduced because of contamination of the light-emitting device 400 due to an impurity.

An example of a material which can be used for the inner lid 455 and the exterior unit 450 is, in addition to a dense inorganic material such as metal, glass, or a ceramics plate, plastic modified with a layer which suppresses entry of an impurity (specifically, a layer containing the dense inorganic material or a layer containing diamond-like carbon, silicon oxide, silicon nitride, or the like).

Note that a material which captures an impurity (e.g., a desiccant or a deoxidant) may be stored in the sealed space formed between the inner lid 455 and the exterior unit 450. A circuit 453 or the like for driving the light-emitting device 400 may also be stored to be electrically connected to a terminal portion 480 of the light-emitting device 400.

Note that the light-emitting device 400 has a light-emitting region on a curved surface, and a character and an image can be displayed in the light-emitting region. The exterior unit 450 has a light-transmitting region in a position which overlaps with the light-emitting device 400, and thus a user can perceive the displayed character and image from the outside of the exterior unit 450. A display portion reaches a side surface of the housing, so that a large amount of data can be displayed.

Further, another space may be provided between the inner lid 455 and the outer lid 460 in addition to the sealed space formed between the inner lid 455 and the exterior unit 450. The housing 490 exemplified in this embodiment includes a secondary battery 457 in the space formed between the inner lid 455 and the outer lid 460. As described above, when a component which needs maintenance or inspection is placed in the space which is not the sealed space, the frequency of contamination of the sealed space due to an impurity can be reduced.

This embodiment can be implemented in combination with any of the other embodiments in this specification as appropriate.

Embodiment 5

In this embodiment, examples of a structure of a light-emitting element which is formed by the method for manufacturing a light-emitting device of one embodiment of the present invention so as to be in contact with a substrate supported in a flat plate-like shape are described with reference to FIGS. 8A to 8E.

The light-emitting element described in this embodiment includes a first electrode, a second electrode, and a layer containing a light-emitting organic compound (hereinafter referred to as EL layer) between the first electrode and the second electrode. One of the first electrode and the second electrode serves as an anode and the other serves as a cathode. A structure of the EL layer is selected as appropriate depending on the polarities and materials of the first electrode and the second electrode.

Note that at least one of the first electrode and the second electrode is formed using a conductive film which transmits visible light.

As the conductive film which transmits visible light, for example, an indium tin oxide film, or a metal thin film which transmits light (e.g., a thin film with a thickness of approximately greater than or equal to 5 nm and less than or equal to 30 nm) can be used.

<Structure Example 1 of Light-Emitting Element>

Figure 8A:
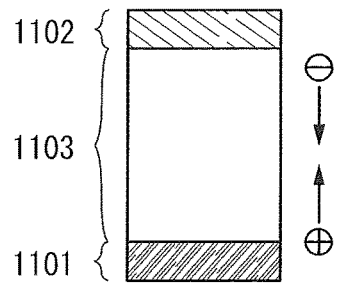
FIGS. 8A to 8E are diagrams each illustrating a light-emitting element that can be applied to a light-emitting device in one embodiment of the present invention.

An example of the structure of the light-emitting element is illustrated in FIG. 8A. In the light-emitting element illustrated in FIG. 8A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. That is, the light-emitting element illustrated in FIG. 8A as Structure Example 1 of a light-emitting element includes one light-emitting unit.

A light-emitting unit 1103 may include at least one light-emitting layer including a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties). In particular, the layer which contains a substance having a high hole-injection property and is provided in contact with the anode and the layer which contains a substance having a high electron-injection property and is provided in contact with the cathode reduce a barrier of carrier injection from the electrodes to the light-emitting unit. These layers can be each referred to as a carrier injection layer.

Figure 8B:
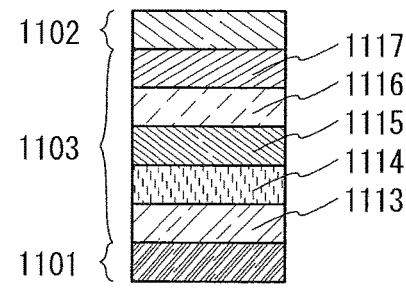

An example of a specific configuration of the light-emitting unit 1103 is illustrated in FIG. 8B. In the light-emitting unit 1103 illustrated in FIG. 8B, a hole-injection layer 1113, a hole-transport layer 1114, a light-emitting layer 1115, an electron-transport layer 1116, and an electron-injection layer 1117 are stacked in this order from the anode 1101 side.

<Structure Example 2 of Light-Emitting Element>

Figure 8C:
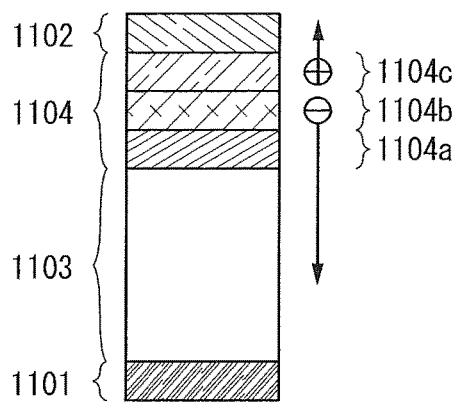

Another example of the structure of the light-emitting element is illustrated in FIG. 8C. In the light-emitting element illustrated in FIG. 8C, the EL layer including the light-emitting unit 1103 is provided between the anode 1101 and the cathode 1102. Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 includes at least a charge generation region. For example, a structure can be employed in which a first charge generation region 1104c, an electron-relay layer 1104b, and an electron-injection buffer 1104a are stacked in that order from the cathode 1102 side.

The behaviors of electrons and holes in the intermediate layer 1104 are described. When a voltage higher than the threshold voltage of the light-emitting element is applied between the anode 1101 and the cathode 1102, holes and electrons are produced in the first charge generation region 1104c, and the holes move into the cathode 1102 and the electrons move into the electron-relay layer 1104b.

The electron-relay layer 1104b has a high electron-transport property and immediately transfers the electrons generated in the first charge generation region 1104c to the electron-injection buffer 1104a. The electron-injection buffer 1104a reduces a barrier which hinders injection of the electrons into the light-emitting unit 1103.

In addition, the electron-relay layer 1104b can prevent, for example, interaction in which the substance included in the first charge generation region 1104c and the substance included in the electron-injection buffer 1104a are in contact with each other at the interface between the electron-injection buffer 1104a and the first charge generation region 1104c and the functions of the first charge generation region 1104c and the electron-injection buffer 1104a are damaged.

The range of choices of materials that can be used for the cathode in Structure Example 2 of the light-emitting element is wider than that of materials that can be used for the cathode in Structure Example 1 of the light-emitting element. This is because a material having a relatively high work function can be used for the cathode in Structure Example 2 as long as the cathode in Structure Example 2 receives at least holes generated by the intermediate layer.

<Structure Example 3 of Light-Emitting Element>

Figure 8D:
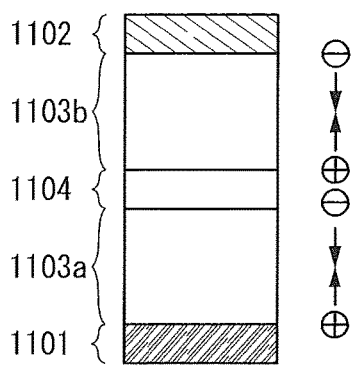
Figure 8E:
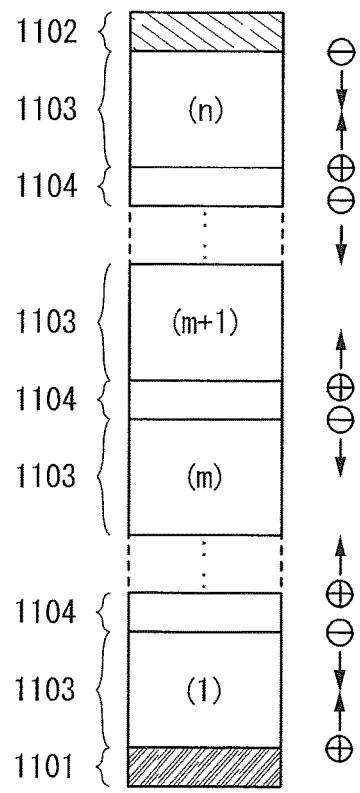

Another example of the structure of the light-emitting element is illustrated in FIG. 8D. In the light-emitting element illustrated in FIG. 8D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode and the cathode is not limited to two. A light-emitting element illustrated in FIG. 8E has what is called a tandem structure in which n light-emitting units 1103 (n is a natural number of two or more) are included. Note that the intermediate layer 1104 is provided between the stacked light-emitting units.

A structure which is similar to the structure of the light-emitting unit 1103 in Structure Example 1 of the light-emitting element can be applied to the light-emitting unit 1103 in Structure Example 3 of the light-emitting element. Further, a structure which is similar to that of the intermediate layer 1104 in Structure Example 2 of the light-emitting element can be applied to the intermediate layer 1104 in Structure Example 3 of the light-emitting element.

When voltage higher than the threshold voltage of the light-emitting element is applied between the anode 1101 and the cathode 1102, holes and electrons are generated in the intermediate layer 1104, and the holes move into the light-emitting unit provided on the cathode 1102 side and the electrons move into the light-emitting unit provided on the anode side.

The holes injected into the light-emitting unit provided on the cathode side are recombined with the electrons injected from the cathode side, so that a light-emitting substance contained in the light-emitting unit emits light. Thus, the holes and electrons generated in the intermediate layer 1104 cause light emission in the respective light-emitting units.

Note that the light-emitting units can be provided in contact with each other when these light-emitting units allow the same structure as the intermediate layer to be formed therebetween. Specifically, when one surface of the light-emitting unit is provided with a charge generation region, the charge generation region functions as a first charge generation region of the intermediate layer; thus, the light-emitting units can be provided in contact with each other.

Note that an interlayer can be provided between the cathode and the n-th light-emitting unit.

Light can be obtained from a light-emitting organic compound contained in the light-emitting unit of any of the above-described light-emitting elements, and the emission color can be selected by changing the type of the light-emitting organic compound.

Further, a plurality of light-emitting materials which emits light of different colors are used, whereby the width of the emission spectrum can be expanded.

Note that in order to obtain white light emission, for example, a structure may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

<Method of Manufacturing Light-Emitting Element>

A method for manufacturing the light-emitting element will be described. Over the first electrode, the layers described above are combined as appropriate to form an EL layer. Any of a variety of methods (e.g., a dry process or a wet process) can be used to form the EL layer depending on the material for the EL layer. For example, a vacuum evaporation method, an inkjet method, a spin coating method, or the like may be selected. Note that a different formation method may be employed for each layer. The second electrode is formed over the EL layer, so that the light-emitting element is manufactured.

This embodiment can be implemented in combination with any of the other embodiments in this specification as appropriate.

Embodiment 6

In this embodiment, electronic devices and lighting devices, each of which includes a light-emitting device formed by the method for manufacturing a light-emitting device of one embodiment of the present invention, are described with reference to FIGS. 9A to 9E.

Figure 9A:
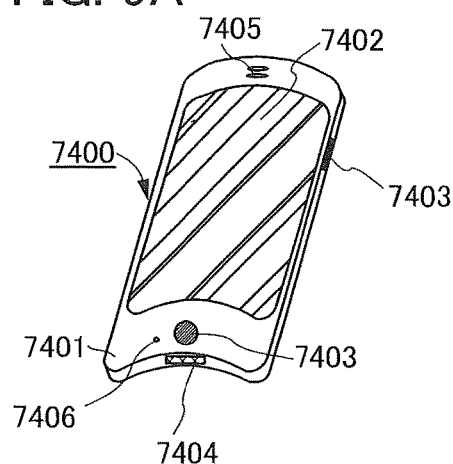
FIGS. 9A to 9E are diagrams illustrating electronic devices and lighting devices each of which includes a light-emitting device of one embodiment of the present invention.

FIG. 9A illustrates an example of a cellular phone. The cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using a light-emitting device for the display portion 7402.

When the display portion 7402 of the cellular phone 7400 illustrated in FIG. 9A is touched with a finger or the like, data can be input into the cellular phone 7400. Further, operations such as making a call and inputting a letter can be performed by touch on the display portion 7402 with a finger or the like.

With the operation buttons 7403, power ON or OFF can be switched. In addition, a variety of images displayed on the display portion 7402 can be switched; switching a mail creation screen to a main menu screen, for example.

Here, the display portion 7402 includes a light-emitting device manufactured by the method of one embodiment of the present invention. Thus, the mobile phone can have a curved display portion and high reliability.

Figure 9B:
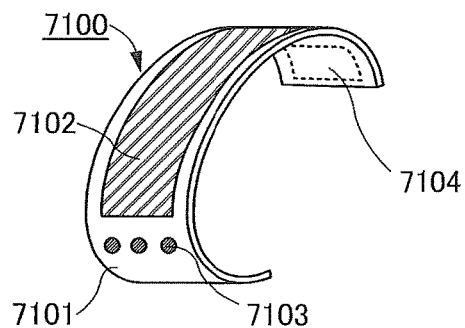

FIG. 9B is an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes a light-emitting device manufactured by the method of one embodiment of the present invention. Thus, the mobile display device can have a curved display portion and high reliability.

Figure 9C:
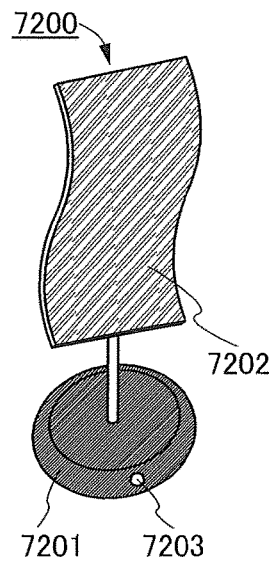
Figure 9D:
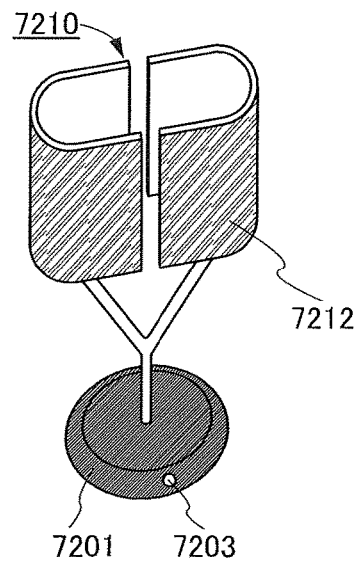
Figure 9E:
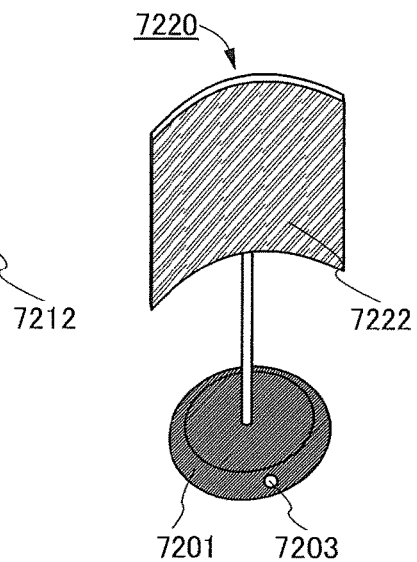

FIGS. 9C to 9E each illustrate an example of a lighting device. Lighting devices 7200, 7210, and 7220 each include a stage 7201 provided with an operation switch 7203 and a light-emitting portion supported by the stage 7201.

The lighting device 7200 illustrated in FIG. 9C includes a light-emitting portion 7202 having a wave-shaped light-emitting surface, which is good-design lighting device.

A light-emitting portion 7212 included in the lighting device 7210 illustrated in FIG. 9D has two convex-curved light-emitting portions symmetrically placed. Thus, all directions can be illuminated with the lighting device 7210 as a center.

The lighting device 7220 illustrated in FIG. 9E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

This embodiment can be implemented in combination with any of the other embodiments in this specification as appropriate.

REFERENCE NUMERALS

10: substrate supporting unit, 100: light-emitting device, 110: substrate, 130: light-emitting element, 200: light-emitting device, 210: substrate, 220: substrate, 220a: substrate, 220b: substrate, 230: light-emitting element, 280a: terminal portion, 280b: terminal portion, 300: light-emitting device, 310: substrate, 320: substrate, 320a: substrate, 320b: substrate, 320c: substrate, 320d: substrate, 330: light-emitting element, 400: light-emitting device, 450: exterior unit, 453: circuit, 455: inner lid, 457: secondary battery, 460: outer lid, 480: terminal portion, 490: housing, 1101: anode, 1102: cathode, 1103: light-emitting unit, 1103a: light-emitting unit, 1103b: light-emitting unit, 1104: intermediate layer, 1104a: electron-injection buffer, 1104c: charge generation region, 1113: hole-injection layer, 1114: hole-transport layer, 1115: light-emitting layer, 1116: electron-transport layer, 1117: electron-injection layer, 7100: portable display device, 7101: housing, 7102: display portion, 7103: operation button, 7104: sending and receiving device, 7200: lighting device, 7201: stage, 7202: light-emitting portion, 7203: operation switch, 7210: lighting device, 7212: light-emitting portion, 7220: lighting device, 7222: light-emitting portion, 7400: cellular phone, 7401: housing, 7402: display portion, 7403: operation button, 7404: external connection port, 7405: speaker, 7406: microphone.

This application is based on Japanese Patent Application Serial No. 2012-178810 filed with Japan Patent Office on Aug. 10, 2012, the entire contents of which are hereby incorporated by reference.

What is claimed is:

1. A semiconductor device comprising:
an exterior unit;
a display panel over the exterior unit;
a circuit over the display panel;
a layer comprising metal over the circuit;
a secondary battery over the layer comprising metal; and
a first lid over the secondary battery,
wherein each of the display panel and the circuit is provided in a first space formed between the exterior unit and the layer,
wherein the secondary battery is provided in a second space formed between the layer and the first lid,
wherein the display panel comprises a light-emitting element, and
wherein a light-emitting region of the display panel comprises curved edge portions.

2. The semiconductor device according to claim 1, wherein the exterior unit comprises any one of metal, glass, and plastic.

3. The semiconductor device according to claim 1, wherein the display panel comprises a metal plate or a plastic plate.

4. The semiconductor device according to claim 1, wherein the display panel comprises a uniaxially-stretched substrate.

5. The semiconductor device according to claim 1, wherein the layer comprising metal is a second lid.

6. The semiconductor device according to claim 1, wherein the light-emitting element comprises an organic layer between a pair of electrodes.

7. The semiconductor device according to claim 1,
wherein the light-emitting element a comprises a first light-emitting layer, a second light-emitting layer, and a third light-emitting layer,
wherein the first light-emitting layer emits blue light,
wherein the second light-emitting layer emits green light, and
wherein the third light-emitting layer emits red light.

8. The semiconductor device according to claim 1, wherein the light-emitting element comprises a first light-emitting unit which emits blue light and a second light-emitting unit which emits yellow light.

9. The semiconductor device according to claim 1, wherein the light-emitting element comprises a first light-emitting unit which emits blue-green light and a second light-emitting unit which emits red light.

* * * * *